(12) United States Patent
Bertin et al.

(10) Patent No.: US 6,943,452 B2
(45) Date of Patent: *Sep. 13, 2005

(54) COAXIAL WIRING WITHIN SOI SEMICONDUCTOR, PCB TO SYSTEM FOR HIGH SPEED OPERATION AND SIGNAL QUALITY

(75) Inventors: Claude Louis Bertin, South Burlington, VT (US); Gordon Arthur Kelley, Essex Junction, VT (US); Dennis Arthur Schmidt, South Burlington, VT (US); William Robert Tonti, Essex Junctiion, VT (US); Jerzy Maria Zalesinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 15 days.

This patent is subject to a terminal disclaimer.

(21) Appl. No.: 10/103,297

(22) Filed: Mar. 21, 2002

(65) Prior Publication Data

US 2002/0101723 A1 Aug. 1, 2002

Related U.S. Application Data

(62) Division of application No. 09/265,098, filed on Mar. 9, 1999, now Pat. No. 6,388,198.

(51) Int. Cl.$^7$ .................... H01L 23/12; H01L 23/48; H01L 23/52; H01L 29/40
(52) U.S. Cl. ...................... 257/774; 174/251
(58) Field of Search ................ 174/251, 70 R, 174/254–259, 72 R, 71 C, 75 C, 88 C; 257/754–757, 773, 774, 686, 776

(56) References Cited

U.S. PATENT DOCUMENTS

| | | | | |
|---|---|---|---|---|
| 3,615,760 A | * | 10/1971 | Williams | 501/153 |
| 5,334,962 A | * | 8/1994 | Higgins et al. | 333/247 |
| 5,614,439 A | * | 3/1997 | Murooka et al. | 437/194 |
| 5,682,062 A | * | 10/1997 | Gaul | 257/686 |
| 5,811,882 A | * | 9/1998 | Latham, IV et al. | 257/776 |
| 5,814,889 A | * | 9/1998 | Gaul | 257/773 |
| 6,388,198 B1 | * | 5/2002 | Bertin et al. | 174/251 |

* cited by examiner

Primary Examiner—David A. Zarneke
(74) Attorney, Agent, or Firm—Scully, Scott, Murphy & Presser; William D. Sabo, Esq.

(57) ABSTRACT

An integrated circuit is provided that contains a coaxial signal line formed at least partially within a silicon-containing substrate. The coaxial signal line comprises an inner conductor having a length, said length axially surrounded by, and insulated from, an outer conductor along said length. A method of preparing such an integrated circuit having said coaxial signal line formed at least partially within a silicon-containing substrate is also disclosed herein.

4 Claims, 10 Drawing Sheets

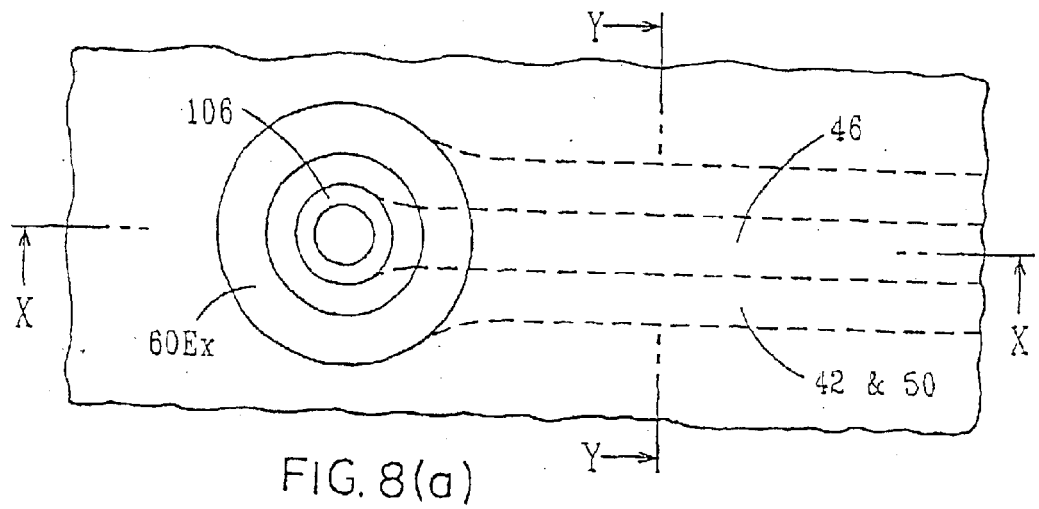
FIG. 8(a)
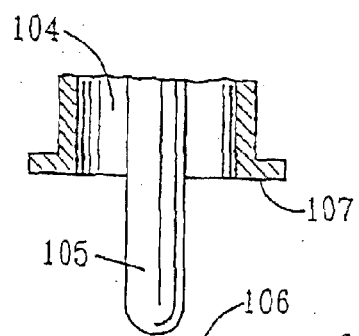
FIG. 8(b)
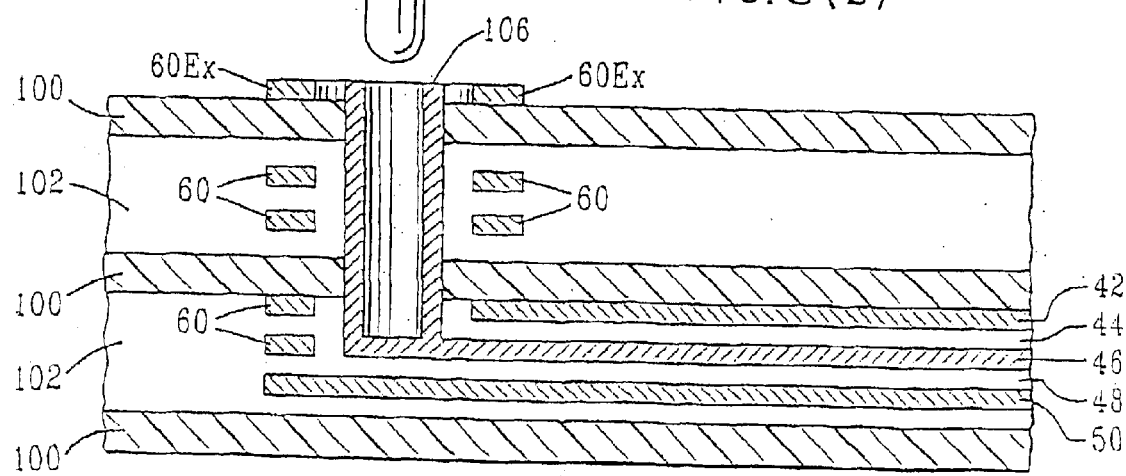

COAXIAL WIRING WITHIN SOI SEMICONDUCTOR, PCB TO SYSTEM FOR HIGH SPEED OPERATION AND SIGNAL QUALITY

RELATED APPLICATIONS

This is a divisional application of U.S. application Ser. No. 09/265,098, filed Mar. 9, 1999 now U.S. Pat. No. 6,388,198.

FIELD OF THE INVENTION

The present invention relates to an integrated circuit, and in particular to an integrated circuit which contains a coaxial signal line formed at least partially within a silicon-containing substrate. Specifically, the inner conductor of the coaxial signal line of the present invention is formed within the silicon-containing substrate and it is completely surrounded by an insulator. The design of the coaxial signal line of the present invention provides a device with increased speed, impedance matching and a high signal quality. The present invention also provides a method of forming an integrated circuit which contains the coaxial signal line of the present invention therein as well as interconnect structures wherein the integrated circuit is connected through the coaxial wiring to an external substrate such as a printed circuit board (PCB).

BACKGROUND OF THE INVENTION

As semiconductor devices become faster and faster, silicon-on-insulator (SOI) devices are becoming more common. In such SOI devices, the signal wiring needs to increase its speed and signal quality. Printed circuit boards typically employ a strip line structure to improve the signal quality.

Typical prior art strip line structures are shown in FIGS. 1(a)–(b). Specifically, the strip line structure comprises a substrate 2, a signal wiring pattern 4, a dielectric 6 and a conductor 8 or 10. In FIG. 1(a), the signal wiring pattern 4 is formed on substrate 2, dielectric 6 is formed on substrate 2 covering the wiring pattern and an upper conductor 8, which functions as a power supply wiring layer or grounded layer, is formed above wiring pattern 4. In FIG. 1(b), signal wiring pattern 4 is formed on dielectric 6 and above substrate 2, a lower conductor 10 having the above mentioned function is formed below wiring pattern 4 and on substrate 2.

Other strip line structures besides those mentioned above are also known. Common to all prior art strip line structures is that one or more layers of conductors are located between the wiring pattern and the dielectric.

One problem with prior art strip line structures is that the signal wiring pattern is not completely surrounded by an insulator. That is, prior art strip line structures are not completely insulated from external conductors. This results in electrical signal leaks from the signal wiring pattern and crosstalk noise is generated due to the influence between adjacent wiring patterns. Also, mismatch of the characteristic impedance occurs.

One solution to this problem is mentioned in U.S. Pat. No. 5,357,138 to Kobayashi. In the Kobayashi disclosure, the coaxial wiring structure comprises a substrate; a grounded lower conductive layer formed on said substrate; a lower dielectric layer selectively formed on said lower conductive layer; a signal wiring pattern selectively formed on the lower dielectric layer; an upper dielectric layer formed of a photosensitive dielectric material on said signal wiring pattern and the lower dielectric layer so as to cover the signal wiring pattern provided on the lower dielectric layer; a grounded upper conductive layer formed on the upper dielectric layer; and grounded conductive layers extending between the upper and lower conductive layers which are disposed in spaces formed in the lower dielectric layer.

Despite the structure provided in the Kobayashi disclosure, there is a need to provide new and improved coaxial wiring structures which can be employed in high speed operations, yet exhibit a high signal quality.

SUMMARY OF THE INVENTION

An object of the present invention is to provide coaxial wiring which can be employed in high speed operations without loss of any signal quality.

Another object of the present invention is to provide coaxial wiring in which matching of the characteristic impedance is improved and crosstalk is reduced.

A further object of the present invention is to provide coaxial wiring which can be employed within a silicon-containing substrate such as a silicon layer formed as part of a silicon-on-insulator (SOI) device or bulk silicon.

A still further object of the present invention is to provide a semiconductor structure having a fully shielded conductor wherein the shield may be at any potential.

These and other objects and advantages are obtained by using the integrated circuit described hereinbelow. Specifically, the integrated circuit of the present invention comprises a silicon-containing substrate; and a coaxial signal line formed at least partially within said silicon-containing substrate, said coaxial signal line comprising an inner conductor having a length, said length axially surrounded by, and insulated from, an outer conductor along said length.

Another aspect of the present invention relates to interconnect structures which comprise at least the integrated circuit of the present invention connected to an external system such as a printed circuit board, flexible card or a second integrated circuit or chip. The interconnection may be made through a C4 solder, an insulating socket or a C4 coaxial socket. The interconnection may or may not be self-aligned.

A further aspect of the present invention relates to a method of fabricating the above described integrated circuit. Specifically, the method of the present invention comprises the steps of:

(a) forming a trench partially within a silicon-containing substrate of a preformed semiconductor structure;

(b) forming sidewall spacers in said trench;

(c) forming a first metal layer over said structure provided in (b);

(d) forming a first insulating layer over said first metal layer;

(e) forming a second metal layer over said first insulating layer;

(f) planarizing the structure formed in (e) down to said trench;

(g) forming a second insulating layer over said planarized structure;

(h) patterning said second insulating layer so as to expose a region of said second metal layer and at least one active device region of said preformed semiconductor structure;

(i) forming a third metal layer over the structure provided in (h); and (j) patterning the same so as to form a means of contacting the active device region within said preformed semiconductor structure with the second metal layer.

In an alternative embodiment of the present invention, steps (h), (i) and (j) above are replaced with: (h') patterning said second insulating layer so as to expose said first metal layer; (i') forming a third metal layer over said second insulating layer and exposed areas of said first metal layer; and (j') patterning the third metal layer and said second insulating layer so that said third metal layer is in contact with the first metal layer but is insulated from the second metal layer by said second insulating layer.

The above processing steps may be repeated any number of times to provide two or more chips interconnected to each other. In an optional embodiment of the present invention, an oxide is deposited on the bottom of the trench prior to depositing the first metal layer.

In another aspect of the present invention, a second level electrical circuit assembly is provided. In accordance with this aspect of the present invention, the second level electrical circuit assembly comprises:

a substrate selected from the group consisting of a circuit card, a circuit board, ceramic and glass; and a coaxial signal line formed at least partially within the substrate, said coaxial signal line comprising an inner conductor having a length, said length axially surrounded by, and insulated from, an outer conductor along said length.

The above assembly can be used with the integrated circuit described above or it can be connected to an external coaxial circuitry or to a coaxial cable by a C4 coaxial socket, an insulated coaxial socket or a μBNC coaxial socket.

A method of forming such a second level electrical circuit assembly is also disclosed herein. Specifically, the method of forming the assembly comprises:

(a) forming a first metal layer on one of the above substrates;

(b) forming a first insulating layer on said first metal layer;

(c) forming a second metal layer on the first insulating layer;

(d) forming a second insulating layer along a center line of said second metal layer so that it covers the second metal layer entirely and adheres to the first metal layer; and (e) forming a third metal layer along center line and over the second insulating layer.

BRIEF DESCRIPTION OF THE DRAWINGS

FIG. 8(a) illustrates a top view of a coaxial connection to a coaxial line and microvia connection.

FIG. 8(b) illustrates a cross-sectional view x-x through the coaxial line of FIG. 8(b).

DETAILED DESCRIPTION OF THE INVENTION

Figure 1A:
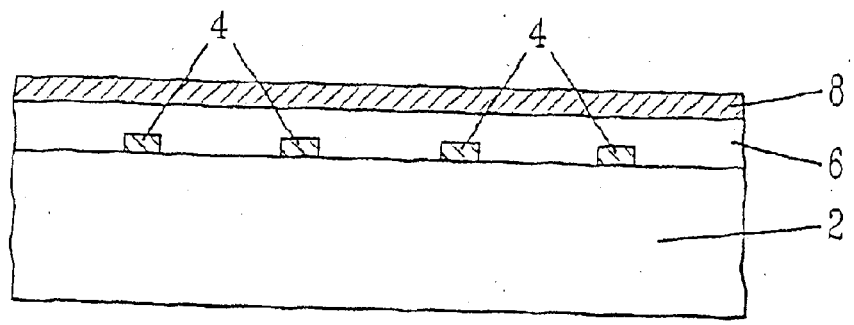
FIGS. 1(a)–(b) are cross-sectional views showing prior art coaxial wiring pattern structures which are made using strip line techniques.
Figure 1B:
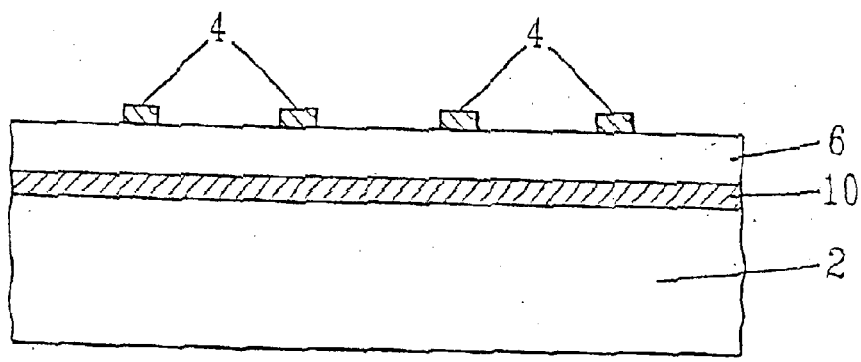

The present invention, which provides a coaxial wiring line formed partially within a silicon-containing substrate, will now be described in greater detail with reference to the accompanying drawings wherein like elements or components of the drawings are referred to by like reference numerals.

Figure 2A:
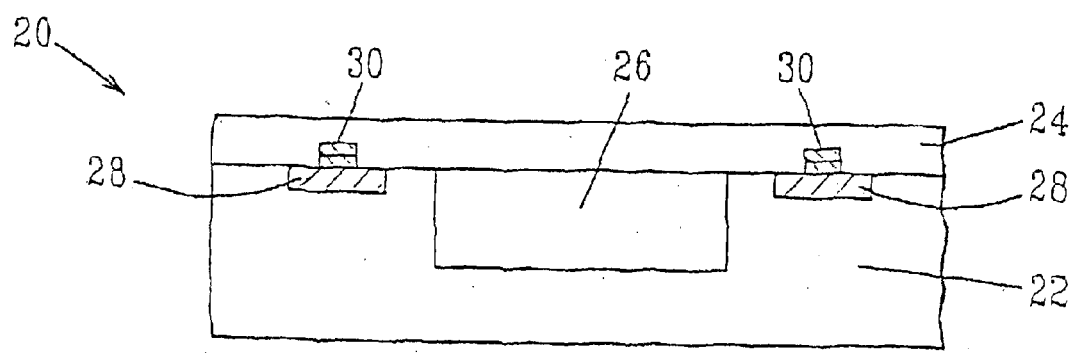
FIGS. 2(a)–(c) are cross-sectional views showing various preformed semiconductor structures which can be employed in the present invention.
Figure 2B:
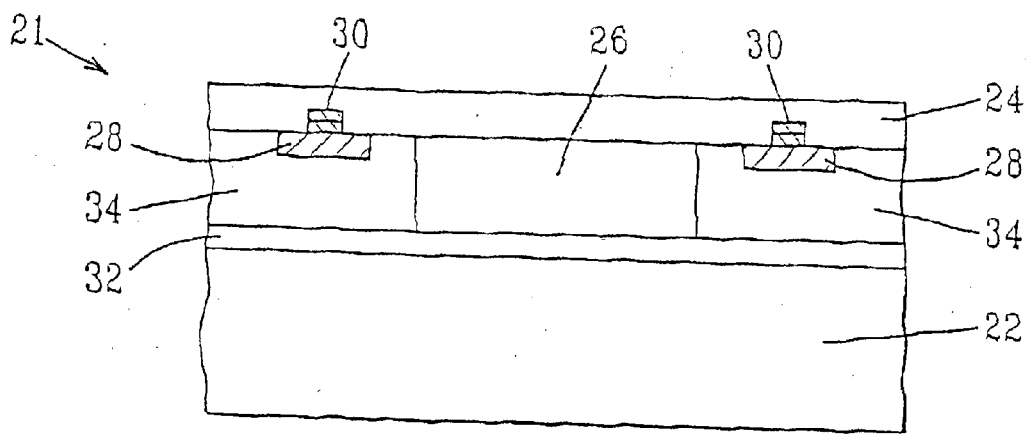
Figure 2C:
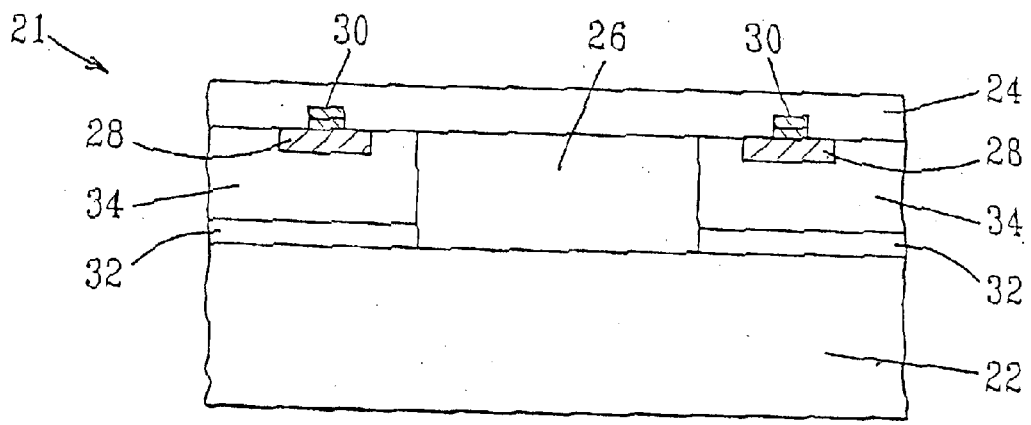

Reference is first made to FIGS. 2(a)–(c) which show various preformed semiconductor structures which can be employed in the present invention. Specifically, in FIG. 2(a), there is shown a cross-sectional view of a preformed semiconductor structure 20 which comprises a region of bulk silicon 22 having a dielectric layer 24 formed on the surface of bulk silicon 22. The region of bulk silicon contains an insulating region 26 (e.g. a nitride region) and at least one active device region 28, e.g. source/drain diffusion regions, formed therein. Dielectric layer 24 may optionally contain at least one active device region 30 therein. When active device regions 28 are source/drain regions, the optional active device regions formed in dielectric layer 24 are gate stack regions.

Regarding FIGS. 2(b)–(c), there are shown additional preformed semiconductor structures which can be employed in the present invention. In these figures, a silicon-on-insulator (SOI) structure 21 is shown. Specifically, the SOI structures shown in FIGS. 2(b)–(c) comprise bulk silicon region 22, a layer of oxide 32 formed on the surface of silicon region 22, a layer of silicon 34 formed on the surface of oxide layer 32 and a dielectric layer 24 formed on the surface of silicon layer 34. In both figures, active device regions are shown in layers 34 and 24. Again, active device region 30 is optional. Insulating region 26 is also present in both figures; the difference being that in FIG. 2(b) the insulating region is formed in silicon layer 34 only, whereas in FIG. 2(c), insulating region 26 is formed in oxide layer 32 as well as silicon layer 34.

The preformed semiconductor structures shown above are formed using conventional processes well known to those skilled in the art. Moreover, the preformed structures contain conventional materials that are also well known to those skilled in the art. Specifically, the preformed structures are formed as follows: First, a trench is formed in either bulk silicon 22, to oxide layer 32, or through oxide layer 32 stopping at bulk silicon 22 by first forming a polish stop layer on the upper most surface of the structure and then standard lithography and dry etching are employed. Next, the trench is filled with an insulating material, e.g. a nitride, and then the structure is planarized by chemical mechanical polishing to provide the preformed structures shown in FIGS. 2(a)–(c).

The method employed in the present invention in forming the coaxial signal line (or coaxial wiring line) at least partially within a silicon-containing substrate will now be described and illustrated in FIGS. 3(a)–(i). In these figures, active device region 30 is not illustrated but, nevertheless it could be present in the structure.

It is noted that the term "silicon-containing substrate" is used herein to denote either bulk silicon region 22 or silicon layer 34 of a SOI device. It should be further noted that while illustration is specifically shown for the preformed semiconductor structure shown in FIG. 2(b) minus active device region 30, the same steps generally apply for FIGS. 2(a) and (c) with the exception that an oxide or another dielectric is required to be deposited in the bottom of the trench prior to forming the first metal layer. This optional embodiment will be described in greater detail hereinbelow.

Figure 3A:
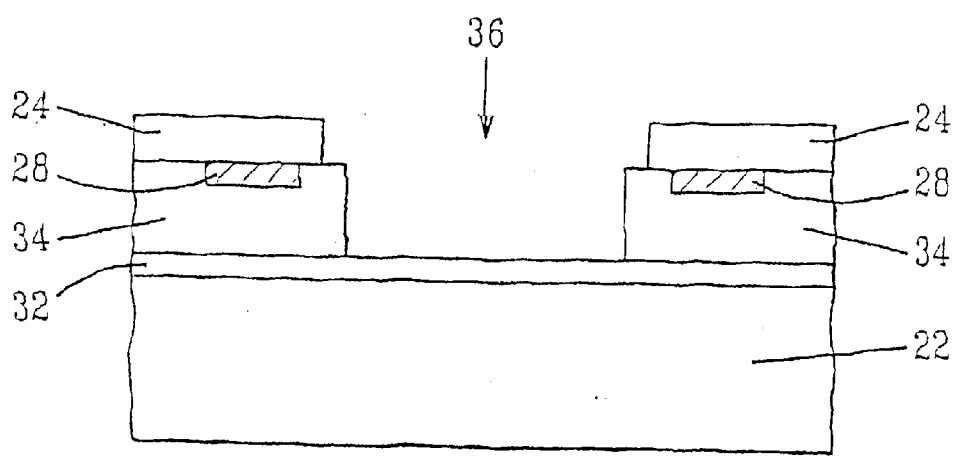
FIGS. 3(a)–(i) are cross-sectional views illustrating various processing steps of the present invention.

Turning to FIG. 3(a), there is shown a semiconductor structure which comprises a trench region 36 formed therein by the selective removal of insulating region 26 and a portion of dielectric layer 24 which is on top of the insulating region. The selective removal process is carried out using conventional lithographic techniques which employ a suitable mask. The mask contains a pattern so that a portion of dielectric layer 24 directly above insulating region 26 is left exposed. The exposed portions of layer 24 and region 26 are then etched using a dry etching technique such as reactive ion etching (RIE) or plasma etching. It is also within the contemplation of the present invention to replace the dry etching process with a wet etch process. When a wet etch is employed, a suitable chemical etchant capable of removing the exposed portions of the structure, yet selective enough to stop after the removal of the insulating region is employed. A typical chemical etchant which can be employed for this purpose is hot phosphoric acid (temperature of same is from about 60°–180° C.). After forming trench region 36, the mask is removed using conventional processes well known to those skilled in the art.

Figure 3B:
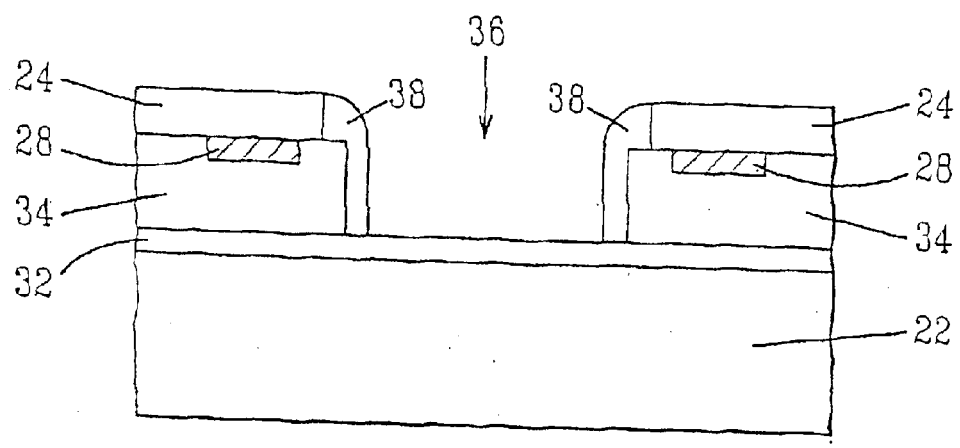

Next, as shown in FIG. 3(b), sidewall spacers 38 composed of an oxide, a nitride or another suitable dielectric material, are formed on the sidewalls of trench 36. The sidewall spacers are formed using conventional deposition processes that are well known in the art. For example, the sidewall spacers may be formed using a conformal chemical vapor deposition (CVD) process or sputtering. Since oxide region 32 lines the bottom of trench 36, the entire trench is insulated from the interior portions of the structure.

Figure 3C:
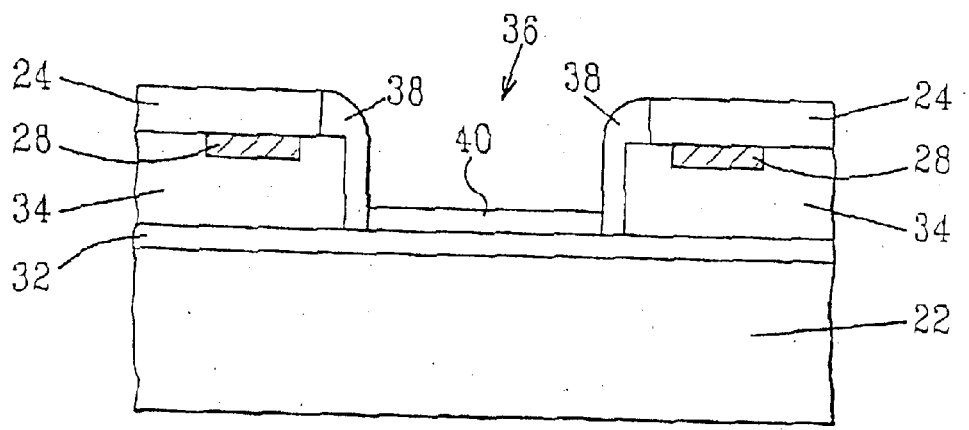

In embodiments wherein the bottom wall of the trench does not contain an underlying oxide, a layer 40 composed of an oxide, nitride or another dielectric material, See FIG. 3(c), must be formed in the bottom of the trench prior to forming the first metal layer. Layer 40 may be formed using the same techniques as described hereinabove in forming sidewall spacers 38.

Figure 3D:
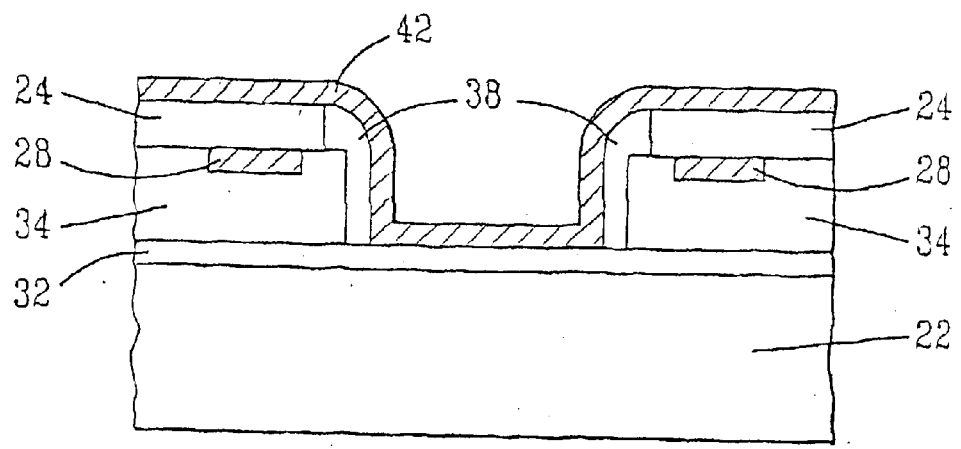

A first metal layer 42 is then formed over the entire structure of FIG. 3(b) or 3(c) using conventional deposition techniques well known to those skilled in the art. Suitable deposition techniques employed in the present invention in forming first metal layer 42 include, but are not limited to: CVD, plasma-enhanced CVD, sputtering, plating and other like deposition processes. The first metal layer which functions as the shield of the coaxial wiring line is composed of any conventional conductive metals including: Cu, W, Al, Pt, Au, AlCu and alloys thereof. This step of the present invention is shown in FIG. 3(d).

Figure 3E:
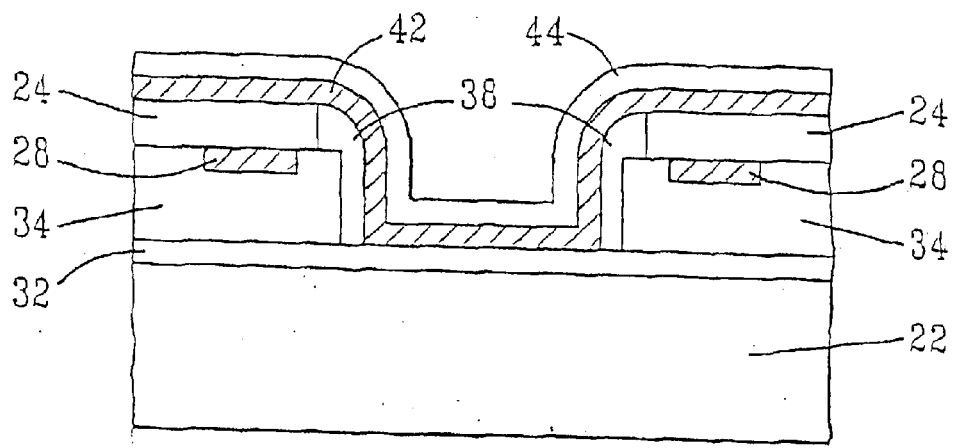

Next, as shown in FIG. 3(e), a first insulating layer 44 is formed over first metal layer 42 using conventional deposition processes well known to those skilled in the art including, but not limited to: CVD, spin-on coating and plasma-enhanced CVD. The first insulating layer is composed of any conventional dielectric materials including high dielectric constant materials ($\epsilon$ greater than 3.0) and low dielectric constant materials ($\epsilon$=3.0 or below). Examples of suitable dielectrics include: oxides, nitrides, polyimides, paralene polymers, diamond-like carbon and other like dielectric materials. Perovskite-type oxides such as barium strontium titanate are also contemplated herein.

Figure 3F:
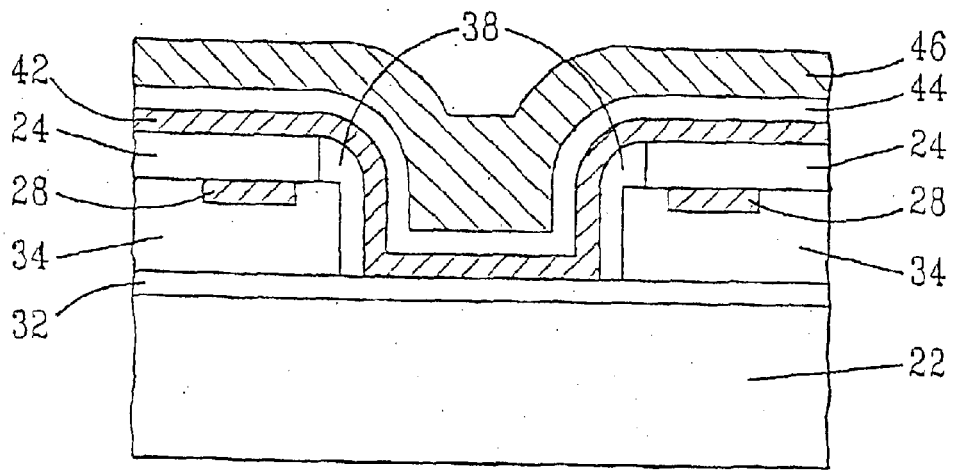

A second metal layer 46 composed of the same or different conductive metal as the first metal layer is then formed over first insulating layer 44 using any of the above mentioned deposition techniques used in forming the first metal layer. In accordance with the present invention, second metal layer functions as the inner conductor of the coaxial wiring line. The structure containing second metal layer 46 is shown in FIG. 3(f).

Figure 3G:
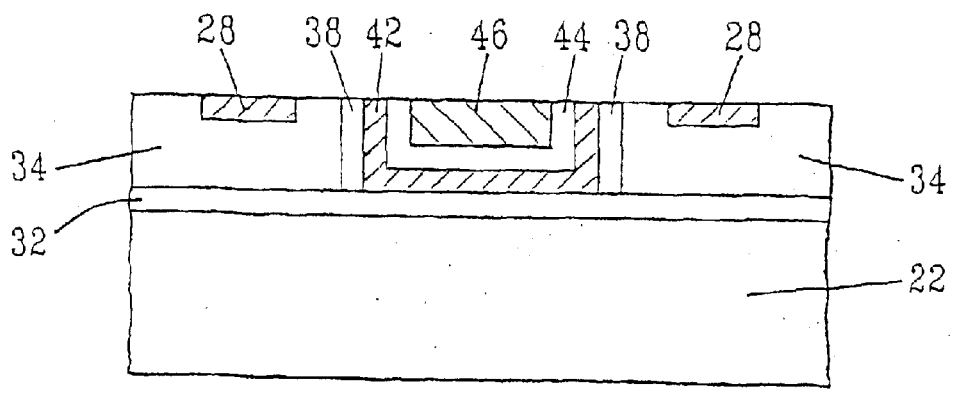

After forming the second metal layer, the structure is planarized as shown in FIG. 3(g). Planarization is carried out using conventional techniques well known to those skilled in the art including: chemical mechanical polishing (CMP) and grinding.

Figure 3H:
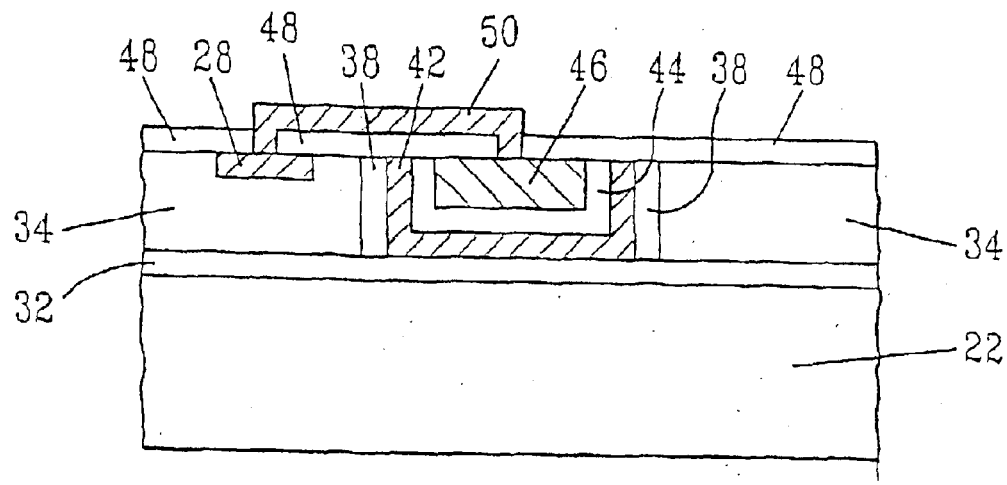

In one embodiment of the present invention, an integrated circuit as shown in FIG. 3(h) is then formed. Specifically, the integrated circuit shown in FIG. 3(h) is prepared by forming a second insulating layer 48 over the structure of FIG. 3(g). The second insulating layer is then patterned so as to expose one of the active device regions 28 and a portion of second metal layer 46. A third metal layer 50 is then formed over the structure including the exposed regions and patterned to provide the integrated circuit shown in FIG. 3(h). The second insulating layer may be composed of the same or different dielectric material as the first insulating layer; likewise the third metal layer may be composed of the same or different conductive metal as used in forming the first and second metal layers. In a highly preferred embodiment of the present invention, all like layers are composed of the same material. It is noted that the third metal layer functions as the outer conductor of the coaxial wiring line.

Figure 3I:
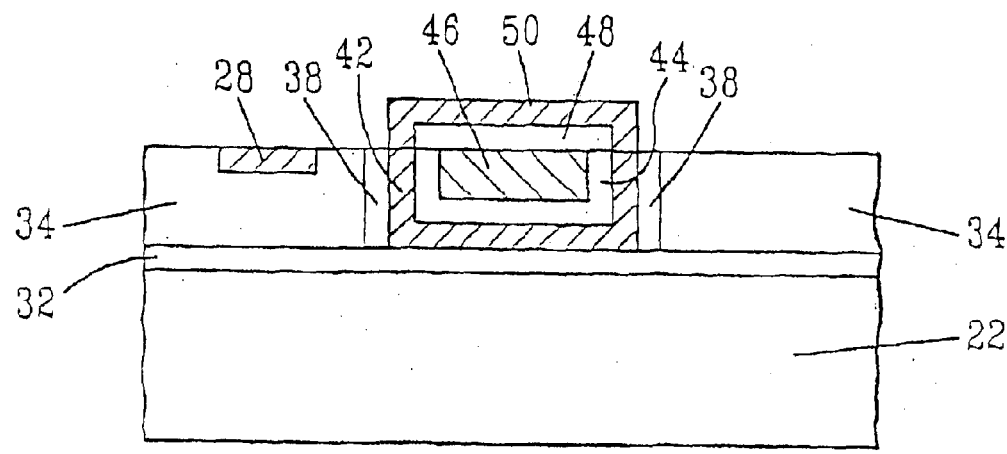

In an alternative embodiment of the present invention, an integrated circuit like the one illustrated in FIG. 3(i) is formed. This integrated circuit is formed by depositing the second insulating layer over the planarized structure; patterning the same so as to expose regions of the first metal layer lining the trench; forming the third metal layer over the entire structure and then removing desired portions of the second insulating layer and the third metal layer so as to provide the integrated circuit shown in FIG. 3(i). In the figure, the upper metal layer, i.e. third metal layer 50, is connected to first metal layer 42.

Figure 4:
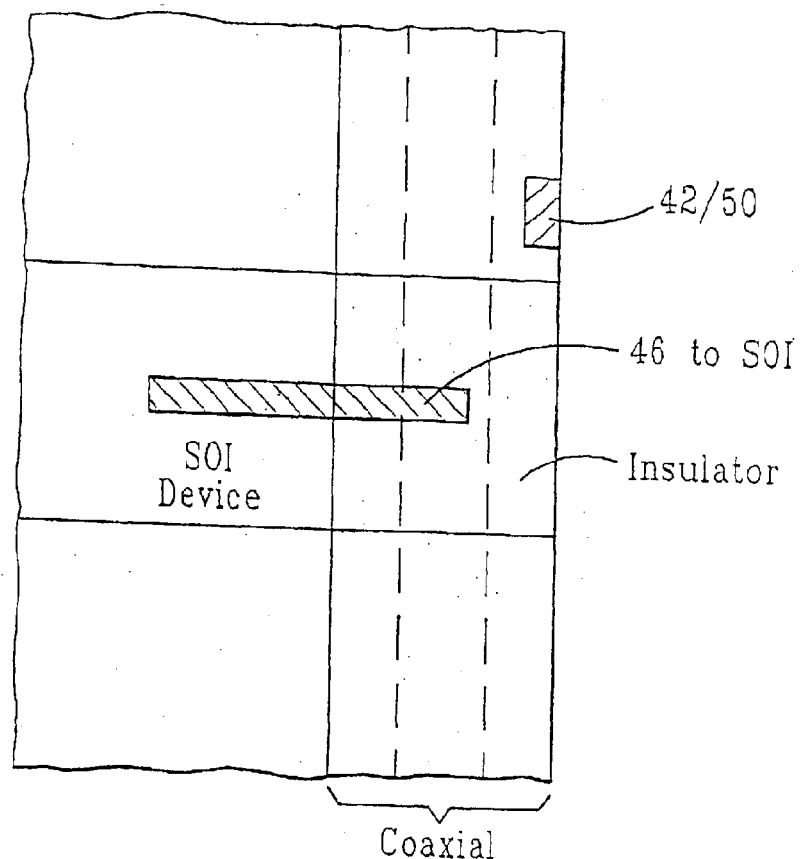
FIG. 4 shows a top view of the final integrated circuit produced using the method of the present invention.

In both integrated circuits shown above, the second metal layer, i.e. inner conductor, is completely isolated from the surrounding metal layers, i.e. shield layer 42 and outer conductor 50, by an insulator. Moreover, the coaxial wiring line is formed at least partially within a silicon-containing substrate. This affords the advantages mentioned supra to the integrated circuits of the present invention. The above mentioned advantages are clearly illustrated in FIG. 4 which is a top view of the integrated circuits produced in the present invention.

The above describes the integrated circuits of the present invention as well as the methods used in manufacturing the same. The follow provides a brief description of how the same can be used in interconnect devices.

Figure 5:
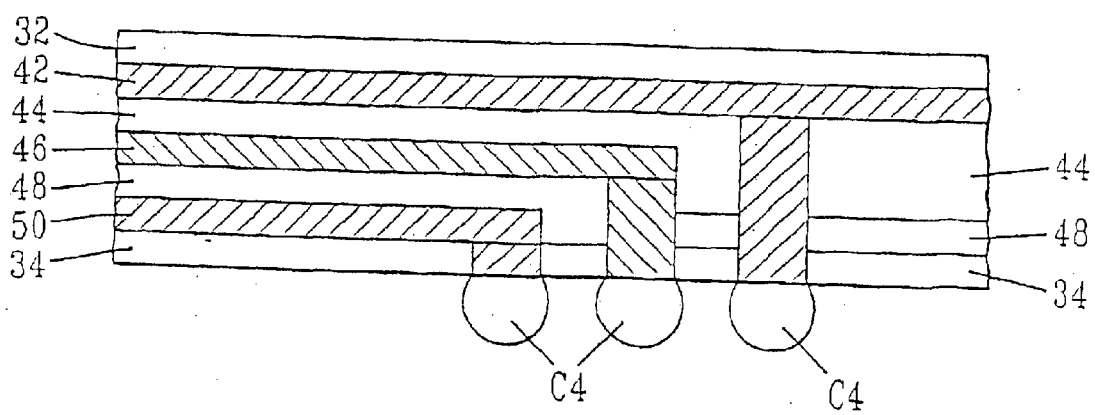
FIG. 5 shows a C4 interconnect structure which can be formed using the integrated circuit of the present invention.

FIG. 5 illustrates a C4 interconnect structure which comprises the integrated circuit of the present invention and C4 solder balls located at the ends of metal shields and metal lines. As shown, the inner conductor, i.e. metal signal 46, of the coaxial wiring line is completely surrounded by an insulator and a portion thereof is formed in a silicon-containing substrate.

Figure 6A:
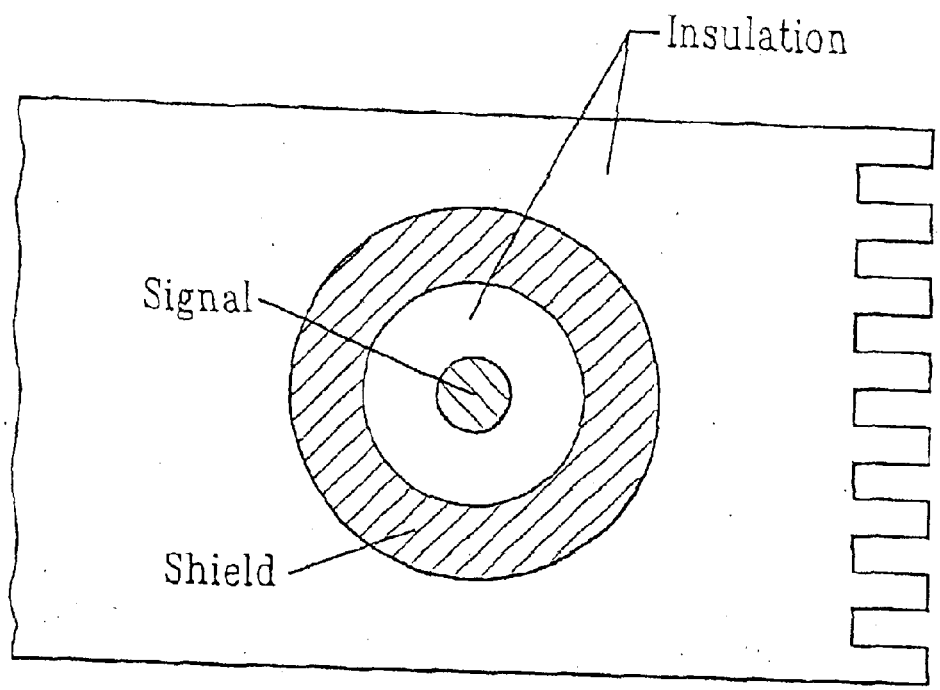
FIGS. 6(a)–(b) show the integrated circuit of the present invention in connection with a printed circuit board; top view (a) and side view (b).
Figure 6B:
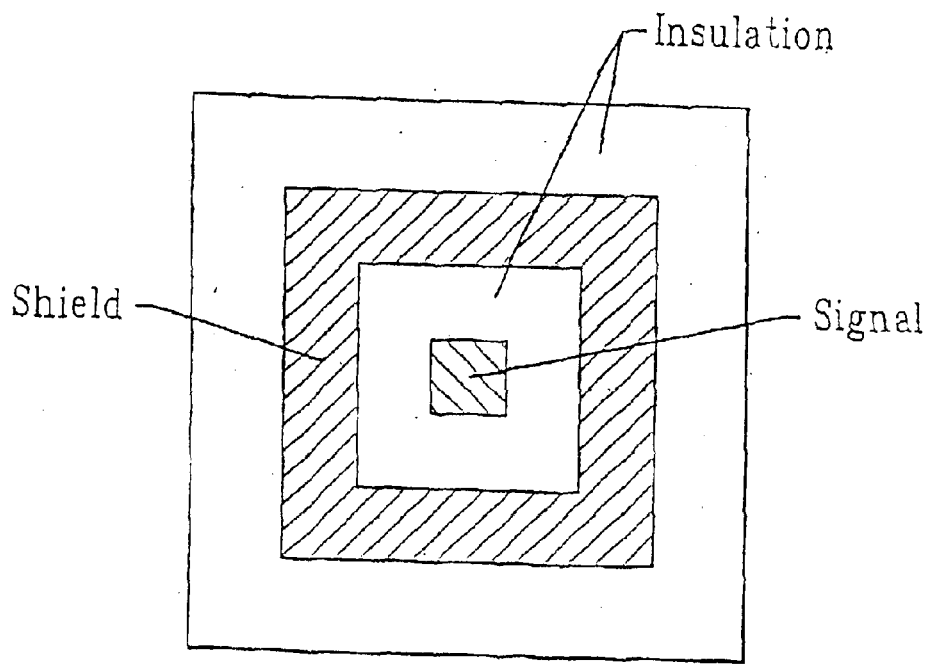

FIGS. 6(a)–(b) show top and side views respectively, wherein the coaxial wiring line of the inventive integrated circuit is interconnected through a circuit board and through a socket to other sections of the system.

Specifically, examining FIGS. 3(c) and 3(h), the C4 interconnectors for the center conductor and the shield can be formed by placing a mask to open these regions and subsequently processing the C4 as indicated in FIG. 5. This coaxial connection is preserved from chip to connector to board as shown in FIG. 6 by providing an insulated inner/outer connector which will mate with the C4 of FIG. 5. Since this connection is in a 360° ring, it is self-aligned.

In the above-referenced drawings, the coaxial wiring line of the present invention is formed partially within silicon and its is illustrated as being interconnected to a semiconductor chip. The above represent one aspect of the present invention. In another aspect, the coaxial wiring line is formed partially with a circuit card, circuit board, ceramic or glass substrate. Combinations of one or more of these substrates; e.g. circuit card/board is also contemplated herein. Such structures are referred to herein as second level electrical circuit assemblies. Broadly speaking, the second level electrical circuit assemblies of the present invention comprise at least one of the above mentioned substrates and a coaxial signal line formed at least partially within the substrate. The coaxial signal line, in this embodiment, is also characterized as having an inner conductor having a length, said length axially surrounded by, and insulated from, an outer conductor along said length.

The second level electrical circuit assemblies of the present invention may contain at least one active device region formed therein. Moreover, they can be used with at least the integrated circuit of the present invention such that it is in direct coaxial connection with the integrated circuit. The assemblies of the present invention may also be in connection with one of the following: external coaxial circuitry, coaxial cable by C4 coaxial socket, insulated coaxial socket or μBNC coaxial socket.

Figure 7A:
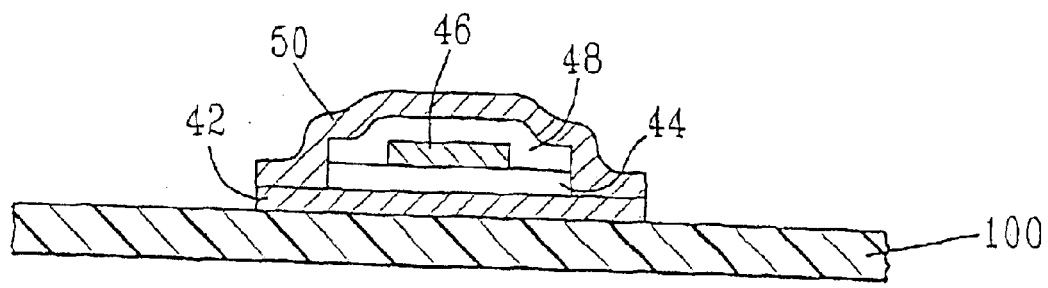
FIGS. 7(a)–(b) illustrate embodiments of the present invention wherein the inventive coaxial signal line is formed on a surface laminar circuitry (SLC) layer; (a) sub-assembly; and (b) a completed card assembly.
Figure 7B:
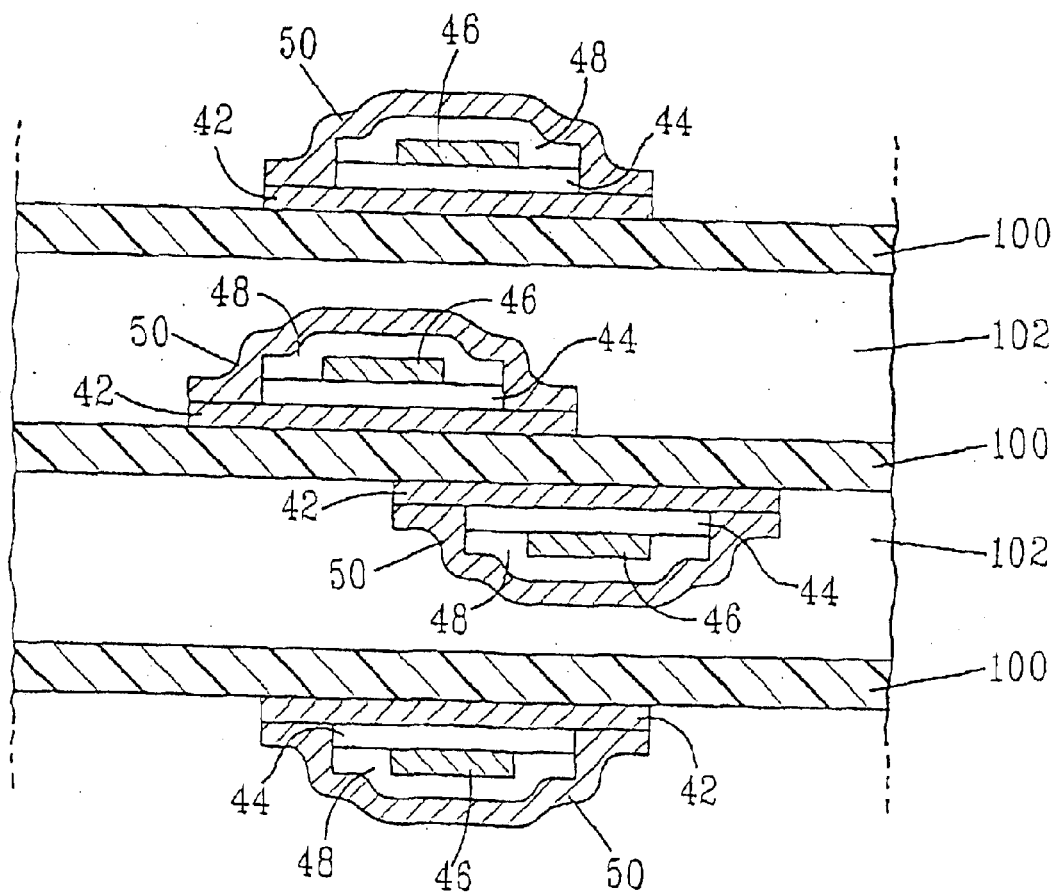

FIGS. 7(a)–(b) illustrate an embodiment of the present invention wherein the coaxial wiring line of the present invention is used with a rigid or flexible circuit card such as a Surface Laminar Circuitry (SLC). The card may be a single or multiple core laminate. Specifically, FIG. 7(a) represents a sub-assembly wherein the inventive coaxial signal line, like the one shown in FIG. 3(i), is formed on a rigid or flexible circuit card 100. This sub-assembly is then laminated with a circuit board layer 102 providing the completed card assembly shown in FIG. 7(b). Note, the coaxial signal line may be present as an internal or external component of the final card assembly.

The above described assemblies are fabricated using the same processing steps and materials as described above. Specifically, the second level assemblies are formed by: (a) forming a first metal layer on one of the above assembly substrates; (b) forming a first insulating layer on said first metal layer; (c) forming a second metal layer on the first insulating layer; (d) forming a second insulating layer along a center line of said second metal layer so that it covers the second metal layer entirely and adheres to the first metal layer; and (e) forming a third metal layer along center line and over the second insulating layer.

In the above process, steps (a)–(e) may be repeated any number of times to create a sub-assembly layer for multi-layer lamination of the substrate. In one embodiment, the internal, signal circuit of the coaxial line is terminated at a vertical wall of the metal layers forming a via having a barrel shape ("via barrel"). In another embodiment, the via barrel is surrounded by, but insulated from, conductive rings which are connected to each other, and to the ground portion of the coaxial wiring (see, for instance, FIGS. 8 and 9).

Figure 8C:
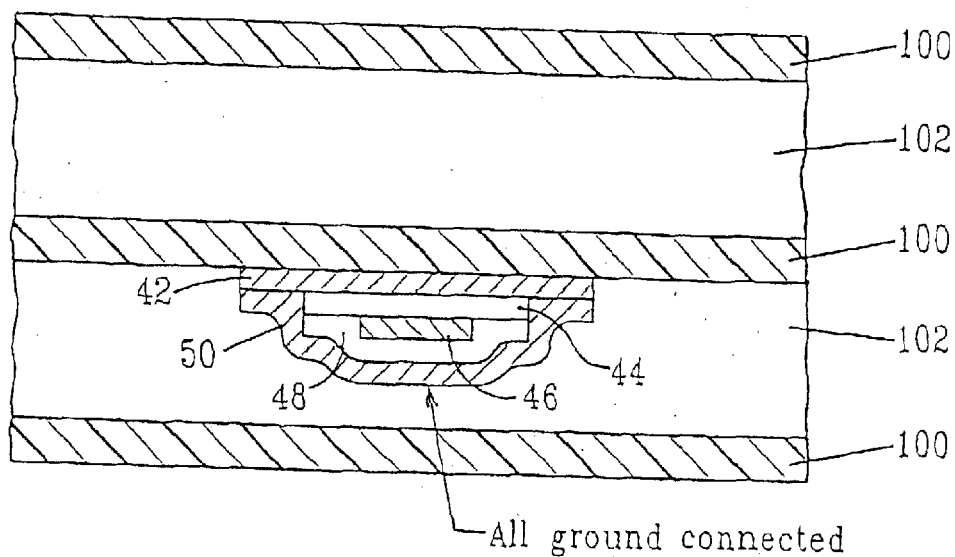
FIG. 8(c) illustrates a cross-sectional view of y-y along the center of the coaxial line and the microvia of FIG. 8(a).
Figure 9:
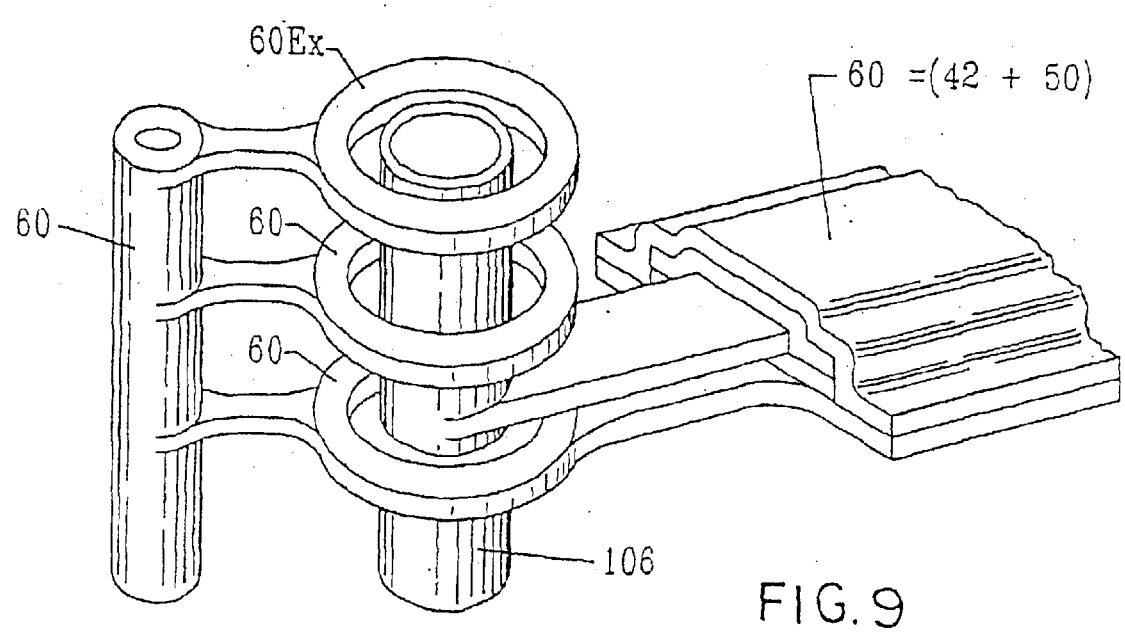
FIG. 9 is an illustration of a second level circuit assembly wherein the coaxial signal line is in the shape of a barrel.

FIGS. 8(a)–(c) show a card coaxial connection to a coaxial cable connection that may be employed in the present invention. Specifically, FIG. 8(a) is a top view of a coaxial line and a microvia connection; FIG. 8(b) is a cross-sectional view x-x through the coaxial line; and FIG. 8(c) is a cross-sectional view y-y along the center of the coaxial line and the microvia. It is noted that reference numerals 100, 102, 42, 44, 46, 48 and 50 are previously defined and reference numeral 60 is the internal ground regions of the structure which are defined by shield layer 42 and outer conductor 50.

The coaxial connection 104 is a novel micro-BNC concentric contact wherein the central cylindrical wire 105 engages the opening of the conductive barrel 106 (signal pin). The external conductive ring of the ground 107 engages the most external ground ring surrounding the via barrel 60Ex. It is also possible to connect the opening of the via barrel to the ring with solder pastes or conductive adhesives. This connection is novel in that it has the same pitch as a C4 joint separated by a wiring space and it contains two conductors within one pitch. In the present case, one of the conductors is defined as ground (Gnd) and the other as I/O (signal). In other embodiments, both conductors could be I/O, or I/O and power, etc. The pitch of the novel micro-connector is approximately 30 mils (2 conductors) vs. 75 mil standard pinned connector (2×75= 150 mils for 2 conductors). This implies that the external I/O obtained using the micro-connector of the present invention will be much denser than today's standards, i.e. it will approach the pitch of the chip internal I/O.

It should be noted that other second level circuit assembly methods and configurations employed by those skilled in the art could also be used herein.

While this invention has been particularly shown and described with respect to preferred embodiments thereof, it will be understood by those skilled in the art that the foregoing and other changes in form and detail may be made without departing from the spirit and scope of the present invention.

What is claimed is:

1. A structure comprising:

a second level electrical circuit assembly comprising a substrate selected from the group consisting of a Si-containing semiconductor, a circuit card, a circuit board, ceramic and glass, and a coaxial signal line located partially within and partially on a surface of said substrate, said coaxial signal line comprising an inner conductor having a length, said length axially surrounded by, and insulated from, an outer conductor along said length; and a Si-containing integrated circuit, said second level circuit assembly is in direct coaxial connection to said Si-containing integrated circuit.

2. The structure of claim 1 wherein said assembly contains at least one active device region formed therein.

3. A structure comprising:

a second level electrical circuit assembly comprising a substrate selected from the group consisting of a Si-containing semiconductor, a circuit card, a circuit board, ceramic and glass, and a coaxial signal line located partially within and partially on said substrate, said coaxial signal line comprising an inner conductor having a length, said length axially surrounded by, and insulated from, an outer conductor along said length, wherein said assembly is connected to at least one of an external coaxial circuitry, a coaxial cable by a C4 coaxial socket, and insulated coaxial socket or a microBNC coaxial socket.

4. A structure comprising: a second level electrical circuit assembly comprising a substrate selected from the group consisting of a Si-containing semiconductor, a circuit card, a circuit board, ceramic and glass, and a coaxial signal line located partially within and partially on said substrate, said coaxial signal line comprising an inner conductor having a length, said length axially surrounded by, and insulated from, an outer conductor along said length, wherein a portion of said inner conductor of said coaxial signal line is coupled to a conductive barrel of a concentric contact.

* * * * *